US012687583B2

(12) United States Patent
Atmur et al.

(10) Patent No.: US 12,687,583 B2
(45) Date of Patent: Jul. 21, 2026

(54) MULTI-MODULE BATTERY SYSTEM TESTING

(71) Applicant: The Boeing Company, Arlington, VA (US)

(72) Inventors: Robert J. Atmur, Whittier, CA (US); Deborah A. Beron-Rawdon, San Pedro, CA (US)

(73) Assignee: The Boeing Company, Arlington, VA (US)

( * ) Notice: Subject to any disclaimer, the term of this patent is extended or adjusted under 35 U.S.C. 154(b) by 175 days.

(21) Appl. No.: 18/791,015

(22) Filed: Jul. 31, 2024

(65) Prior Publication Data

US 2026/0036638 A1     Feb. 5, 2026

(51) Int. Cl.
*G01R 31/385*          (2019.01)

(52) U.S. Cl.
CPC ................................. *G01R 31/386* (2019.01)

(58) Field of Classification Search
CPC .. G01R 31/386; G01R 31/396; H01M 10/482
USPC ......................................................... 324/426
See application file for complete search history.

(56) References Cited

U.S. PATENT DOCUMENTS

| | | | | |
|---|---|---|---|---|
| 10,120,034 | B2 * | 11/2018 | Hanking | H01M 10/482 |
| 10,421,367 | B2 * | 9/2019 | Alser | G01R 31/006 |
| 11,349,316 | B2 | 5/2022 | Atmur | |
| 11,764,589 | B2 | 9/2023 | Atmur | |
| 2004/0239333 | A1 * | 12/2004 | Kikuchi | H01M 10/482 |
| | | | | 324/434 |
| 2013/0088201 | A1 | 4/2013 | Iwasawa et al. | |

| | | | | |
|---|---|---|---|---|
| 2019/0152333 | A1 * | 5/2019 | Huynh | H01M 10/482 |
| 2023/0396077 | A1 | 12/2023 | Atmur | |
| 2024/0429469 | A1 * | 12/2024 | Ren | H01M 10/482 |

FOREIGN PATENT DOCUMENTS

| | | |
|---|---|---|
| CN | 105095975 A | 11/2015 |
| CN | 117465269 A | 1/2024 |
| DE | 102020119471 A1 | 1/2021 |
| KR | 1020160098766 A | 8/2016 |
| KR | 1020190043764 A | 4/2019 |
| KR | 1020230143296 A | 10/2023 |

OTHER PUBLICATIONS

European Patent Office, Extended European Search Report Issued in Application No. 25197857.3, Jan. 2, 2026, Germany, 8 pages.
European Patent Office, Extended European Search Report Issued in Application No. 25189168.5, Jan. 13, 2026, Germany, 12 pages.

* cited by examiner

*Primary Examiner* — Roberto Velez
(74) *Attorney, Agent, or Firm* — Alleman Hall LLP

(57) ABSTRACT

A method, a battery management system, and an article of manufacture for testing a battery system are disclosed. The battery system can include a plurality of battery modules. A test process is performed with respect to the battery system via the battery management system that includes a controller device and a plurality of module interface devices. For each battery module of the plurality of battery modules, a respective module interface device of the plurality of module interface devices is operatively coupled to anode and cathode terminals of that battery module. Each module interface device can include a measurement circuit and a switching circuit. The test process can be used to independently connect, disconnect, and measure various operating conditions of the battery modules and load.

20 Claims, 7 Drawing Sheets

Figure 3A:
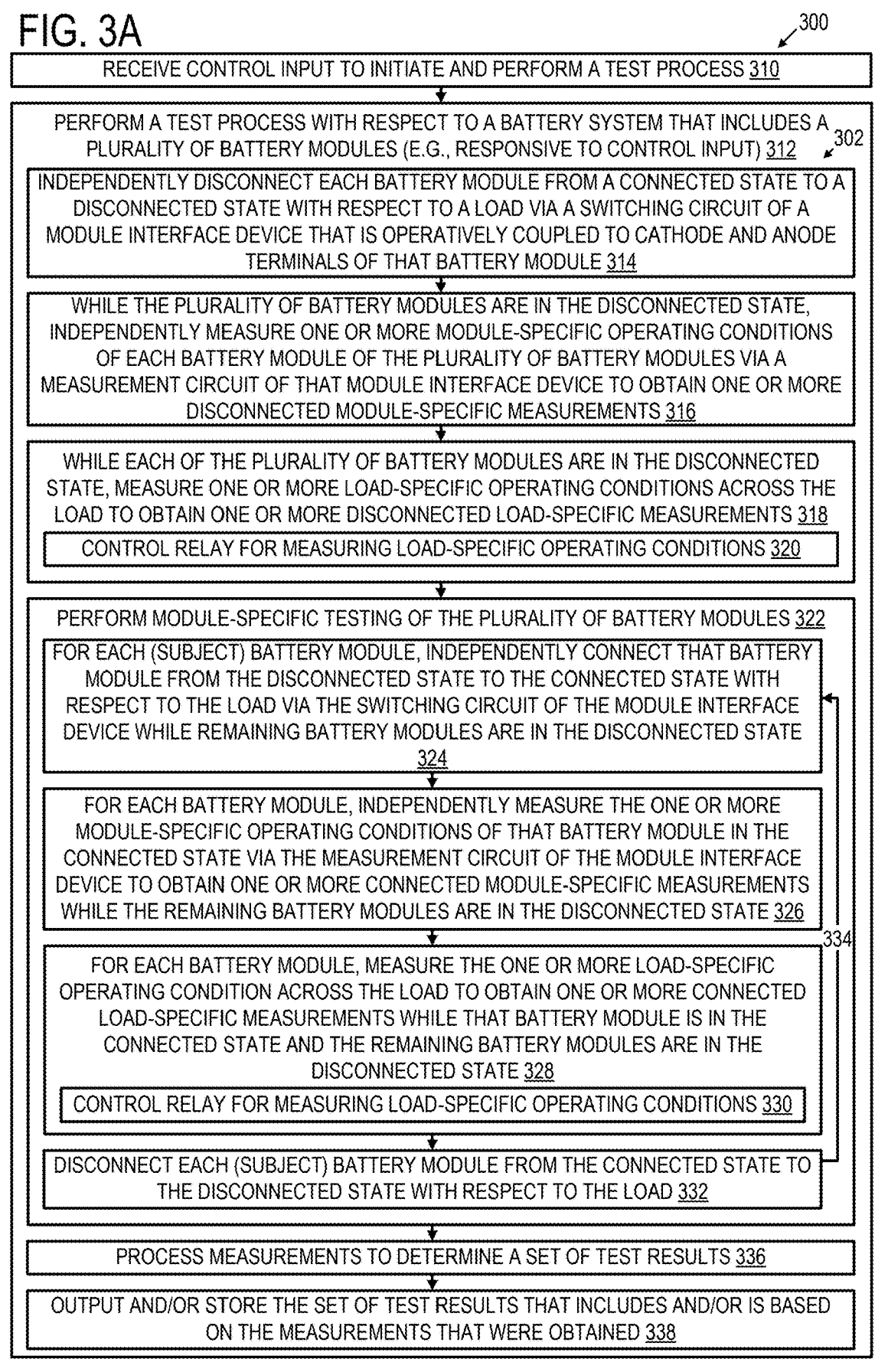

FIG. 3A                                                300

RECEIVE CONTROL INPUT TO INITIATE AND PERFORM A TEST PROCESS 310

PERFORM A TEST PROCESS WITH RESPECT TO A BATTERY SYSTEM THAT INCLUDES A PLURALITY OF BATTERY MODULES (E.G., RESPONSIVE TO CONTROL INPUT) 312    302

INDEPENDENTLY DISCONNECT EACH BATTERY MODULE FROM A CONNECTED STATE TO A DISCONNECTED STATE WITH RESPECT TO A LOAD VIA A SWITCHING CIRCUIT OF A MODULE INTERFACE DEVICE THAT IS OPERATIVELY COUPLED TO CATHODE AND ANODE TERMINALS OF THAT BATTERY MODULE 314

WHILE THE PLURALITY OF BATTERY MODULES ARE IN THE DISCONNECTED STATE, INDEPENDENTLY MEASURE ONE OR MORE MODULE-SPECIFIC OPERATING CONDITIONS OF EACH BATTERY MODULE OF THE PLURALITY OF BATTERY MODULES VIA A MEASUREMENT CIRCUIT OF THAT MODULE INTERFACE DEVICE TO OBTAIN ONE OR MORE DISCONNECTED MODULE-SPECIFIC MEASUREMENTS 316

WHILE EACH OF THE PLURALITY OF BATTERY MODULES ARE IN THE DISCONNECTED STATE, MEASURE ONE OR MORE LOAD-SPECIFIC OPERATING CONDITIONS ACROSS THE LOAD TO OBTAIN ONE OR MORE DISCONNECTED LOAD-SPECIFIC MEASUREMENTS 318

CONTROL RELAY FOR MEASURING LOAD-SPECIFIC OPERATING CONDITIONS 320

PERFORM MODULE-SPECIFIC TESTING OF THE PLURALITY OF BATTERY MODULES 322

FOR EACH (SUBJECT) BATTERY MODULE, INDEPENDENTLY CONNECT THAT BATTERY MODULE FROM THE DISCONNECTED STATE TO THE CONNECTED STATE WITH RESPECT TO THE LOAD VIA THE SWITCHING CIRCUIT OF THE MODULE INTERFACE DEVICE WHILE REMAINING BATTERY MODULES ARE IN THE DISCONNECTED STATE 324

FOR EACH BATTERY MODULE, INDEPENDENTLY MEASURE THE ONE OR MORE MODULE-SPECIFIC OPERATING CONDITIONS OF THAT BATTERY MODULE IN THE CONNECTED STATE VIA THE MEASUREMENT CIRCUIT OF THE MODULE INTERFACE DEVICE TO OBTAIN ONE OR MORE CONNECTED MODULE-SPECIFIC MEASUREMENTS WHILE THE REMAINING BATTERY MODULES ARE IN THE DISCONNECTED STATE 326

334

FOR EACH BATTERY MODULE, MEASURE THE ONE OR MORE LOAD-SPECIFIC OPERATING CONDITION ACROSS THE LOAD TO OBTAIN ONE OR MORE CONNECTED LOAD-SPECIFIC MEASUREMENTS WHILE THAT BATTERY MODULE IS IN THE CONNECTED STATE AND THE REMAINING BATTERY MODULES ARE IN THE DISCONNECTED STATE 328

CONTROL RELAY FOR MEASURING LOAD-SPECIFIC OPERATING CONDITIONS 330

DISCONNECT EACH (SUBJECT) BATTERY MODULE FROM THE CONNECTED STATE TO THE DISCONNECTED STATE WITH RESPECT TO THE LOAD 332

PROCESS MEASUREMENTS TO DETERMINE A SET OF TEST RESULTS 336

OUTPUT AND/OR STORE THE SET OF TEST RESULTS THAT INCLUDES AND/OR IS BASED ON THE MEASUREMENTS THAT WERE OBTAINED 338

Figure 3B:
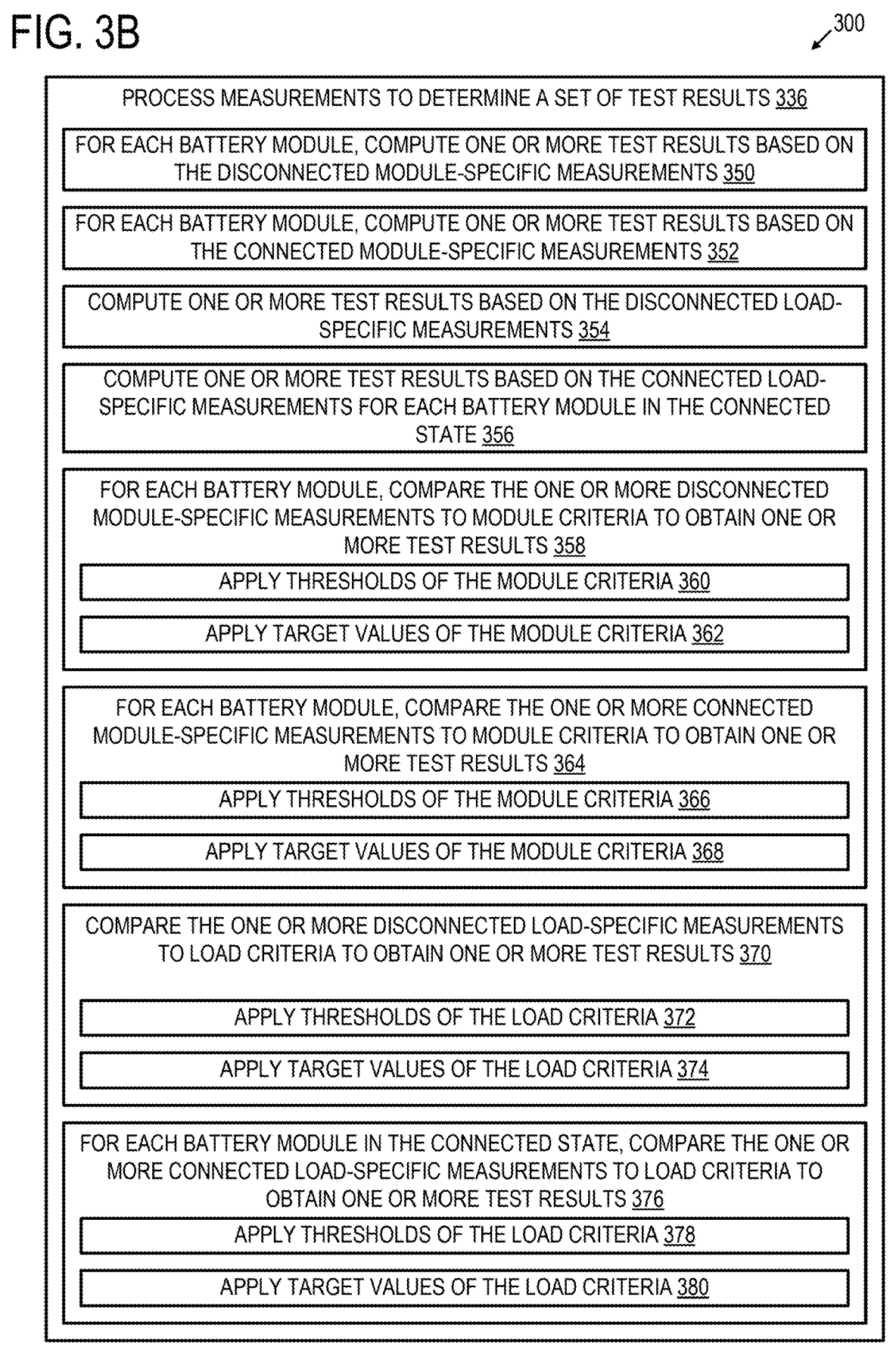

PROCESS MEASUREMENTS TO DETERMINE A SET OF TEST RESULTS 336

FOR EACH BATTERY MODULE, COMPUTE ONE OR MORE TEST RESULTS BASED ON THE DISCONNECTED MODULE-SPECIFIC MEASUREMENTS 350

FOR EACH BATTERY MODULE, COMPUTE ONE OR MORE TEST RESULTS BASED ON THE CONNECTED MODULE-SPECIFIC MEASUREMENTS 352

COMPUTE ONE OR MORE TEST RESULTS BASED ON THE DISCONNECTED LOAD-SPECIFIC MEASUREMENTS 354

COMPUTE ONE OR MORE TEST RESULTS BASED ON THE CONNECTED LOAD-SPECIFIC MEASUREMENTS FOR EACH BATTERY MODULE IN THE CONNECTED STATE 356

FOR EACH BATTERY MODULE, COMPARE THE ONE OR MORE DISCONNECTED MODULE-SPECIFIC MEASUREMENTS TO MODULE CRITERIA TO OBTAIN ONE OR MORE TEST RESULTS 358

APPLY THRESHOLDS OF THE MODULE CRITERIA 360

APPLY TARGET VALUES OF THE MODULE CRITERIA 362

FOR EACH BATTERY MODULE, COMPARE THE ONE OR MORE CONNECTED MODULE-SPECIFIC MEASUREMENTS TO MODULE CRITERIA TO OBTAIN ONE OR MORE TEST RESULTS 364

APPLY THRESHOLDS OF THE MODULE CRITERIA 366

APPLY TARGET VALUES OF THE MODULE CRITERIA 368

COMPARE THE ONE OR MORE DISCONNECTED LOAD-SPECIFIC MEASUREMENTS TO LOAD CRITERIA TO OBTAIN ONE OR MORE TEST RESULTS 370

APPLY THRESHOLDS OF THE LOAD CRITERIA 372

APPLY TARGET VALUES OF THE LOAD CRITERIA 374

FOR EACH BATTERY MODULE IN THE CONNECTED STATE, COMPARE THE ONE OR MORE CONNECTED LOAD-SPECIFIC MEASUREMENTS TO LOAD CRITERIA TO OBTAIN ONE OR MORE TEST RESULTS 376

APPLY THRESHOLDS OF THE LOAD CRITERIA 378

APPLY TARGET VALUES OF THE LOAD CRITERIA 380

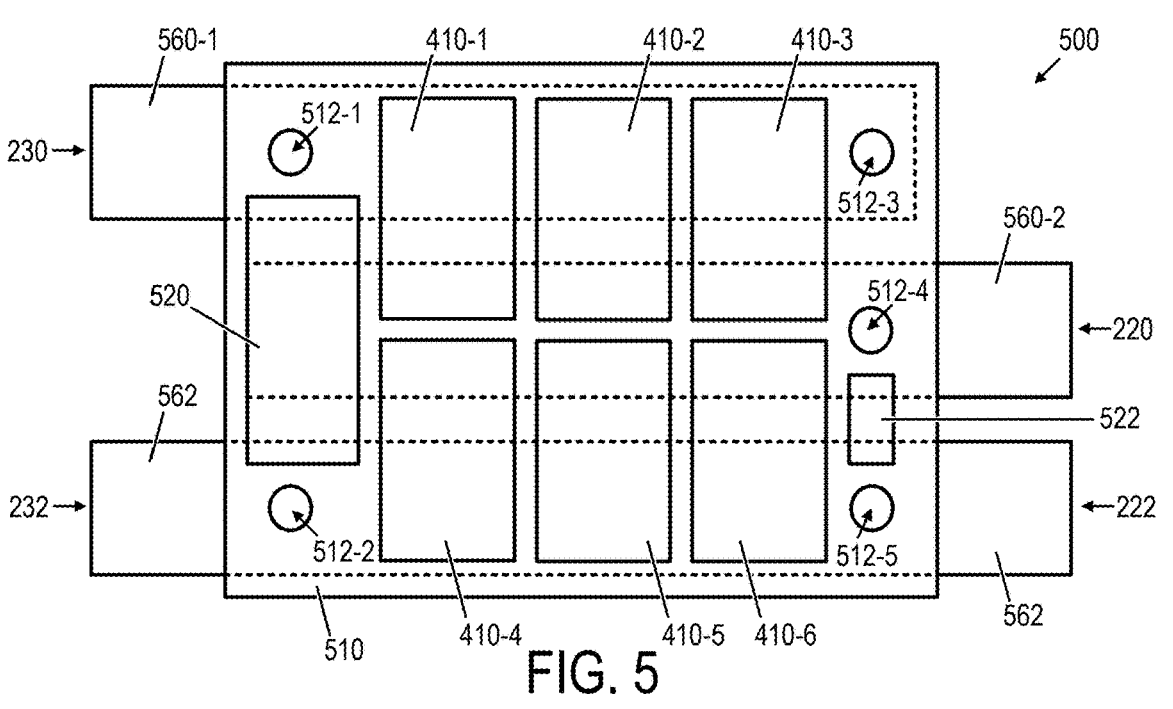
FIG. 5
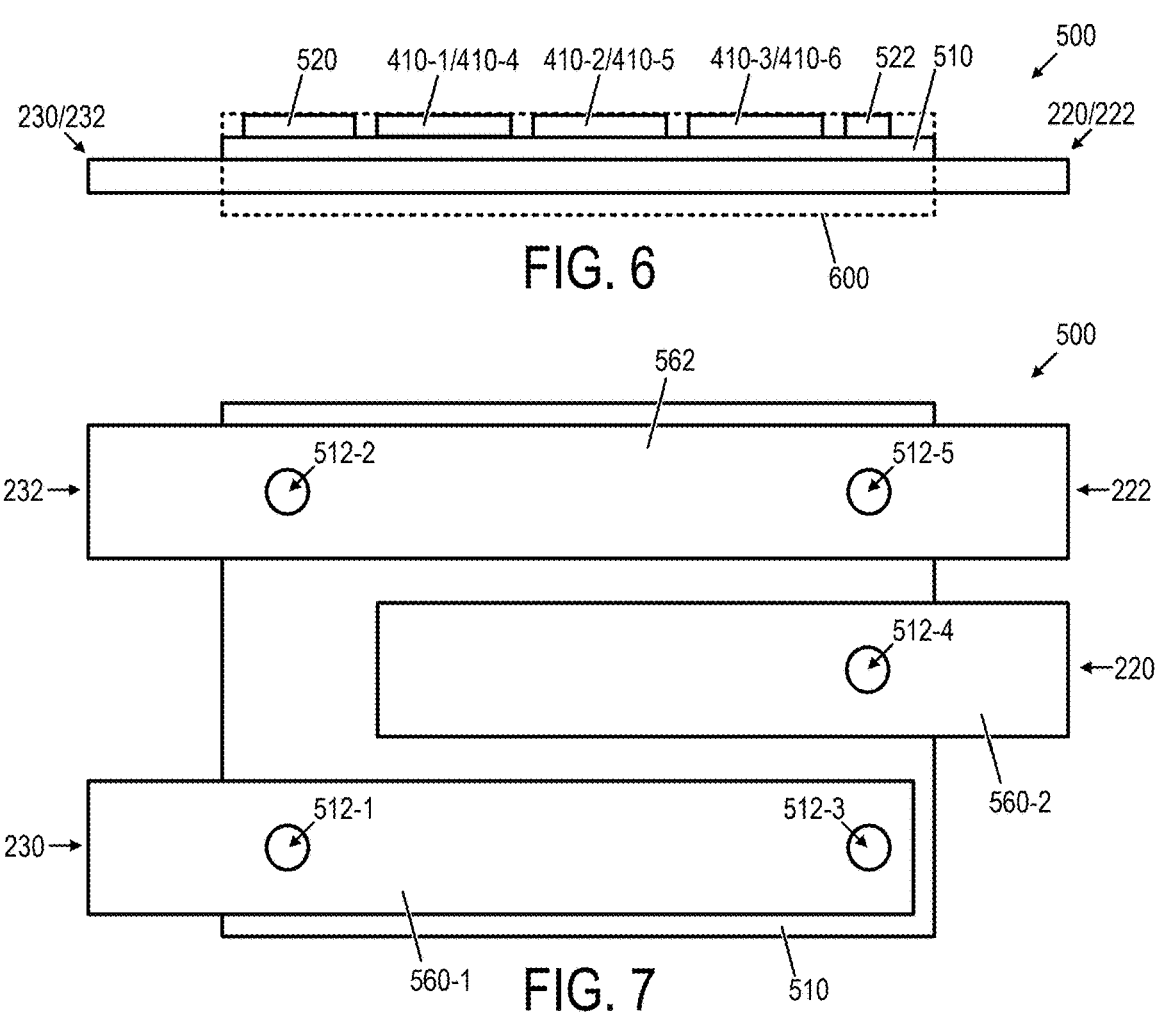
FIG. 6
FIG. 7

MULTI-MODULE BATTERY SYSTEM TESTING

FIELD

A disclosed invention relates generally to testing battery systems that include a plurality of battery modules.

BACKGROUND

Battery systems can incorporate a plurality of battery modules to provide an overall battery function and performance with respect to a load. Fixed and mobile platforms, such as aircraft, spacecraft, land-based and underwater vehicles as well power grid systems can have single to multi-module battery systems on-board for which failures can result in loss or damage to the vehicles or facilities during operation. Multi-module battery systems, including high voltage battery systems, as well as battery systems located on-board mobile platforms and fixed systems can present significant challenges with respect to determining the status of individual battery modules and the status of the overall battery system. In this context, "status" can refer to operating conditions indicative of health and performance of the individual battery modules and the overall battery system.

SUMMARY

A method, a battery management system, and an article of manufacture for testing a battery system are disclosed. The battery system can include a plurality of battery modules. A test process is performed with respect to the battery system via the battery management system that includes a controller device and a plurality of module interface devices. For each battery module of the plurality of battery modules, a respective module interface device of the plurality of module interface devices is operatively coupled to anode and cathode terminals of that battery module. Each module interface device can include a measurement circuit and a switching circuit. The test process can be used to independently connect, disconnect, and measure various operating conditions of the battery modules.

The test process performed at or by the controller device can include independently disconnecting each battery module of the plurality of battery modules from a connected state to a disconnected state with respect to an electrical load via a switching circuit of the module interface device that is operatively coupled to the cathode and anode terminals of that battery module.

The test process performed at or by the controller device can include, for each battery module of the plurality of battery modules, independently connecting that battery module from the disconnected state to the connected state with respect to the electrical load via the switching circuit of the module interface device that is operatively coupled to the cathode and anode terminals of that battery module while remaining battery modules of the plurality of battery modules are in the disconnected state.

The test process performed at or by the controller device can include, for each battery module of the plurality of battery modules, independently measuring a module-specific operating condition of that battery module in the connected state via a measurement circuit of the module interface device that is operatively coupled to the cathode and anode terminals of that battery module to obtain a module-specific measurement while the remaining battery modules are in the disconnected state. The module-specific operating condition can include an electrical voltage or an electrical current, as examples.

The test process performed at or by the controller device can include, for each battery module of the plurality of battery modules of the battery system, measuring a load-specific operating condition across the electrical load to obtain a load-specific measurement while that battery module is in the connected state and the remaining battery modules are in the disconnected state. The load-specific operating condition can include an electrical voltage or an electrical current, as examples.

The test process performed at or by the controller device can include, while each of the plurality of battery modules are in the disconnected state, measuring the load-specific operating condition across the electrical load to obtain an additional load-specific measurement.

The test process performed at or by the controller device can include, while the plurality of battery modules are in the disconnected state, independently measuring the module-specific operating condition of each battery module of the plurality of battery modules via the measurement circuit of the module interface device that is operatively coupled to the cathode and anode terminals of that battery module to obtain an additional module-specific measurement.

The test process performed at or by the controller device can include, outputting a set of test results that includes or is based on one or more of: (1) the module-specific measurement obtained for each battery module of the plurality of battery modules while that battery module is in the connected state and the remaining battery modules are in the disconnected state, (2) the load-specific measurement obtained for each battery module of the plurality of battery modules while that battery module is in the connected state and the remaining battery modules are in the disconnected state, (3) the additional load-specific measurement obtained while each of the plurality of battery modules is in the disconnected state, and (4) the additional module-specific measurement obtained for each battery module while each of the plurality of battery modules is in the disconnected state.

BRIEF DESCRIPTION OF THE DRAWINGS

FIGS. 3A and 3B are flow diagrams depicting an example method for testing a battery system that includes a plurality of battery modules.

FIG. 5 depicts a first view of an example configuration of the module interface device.

FIG. 6 depicts a second view of the example configuration of the module interface device of FIG. 5.

FIG. 7 depicts a third view of the example configuration of the module interface device of FIG. 5.

DETAILED DESCRIPTION

Figure 1:
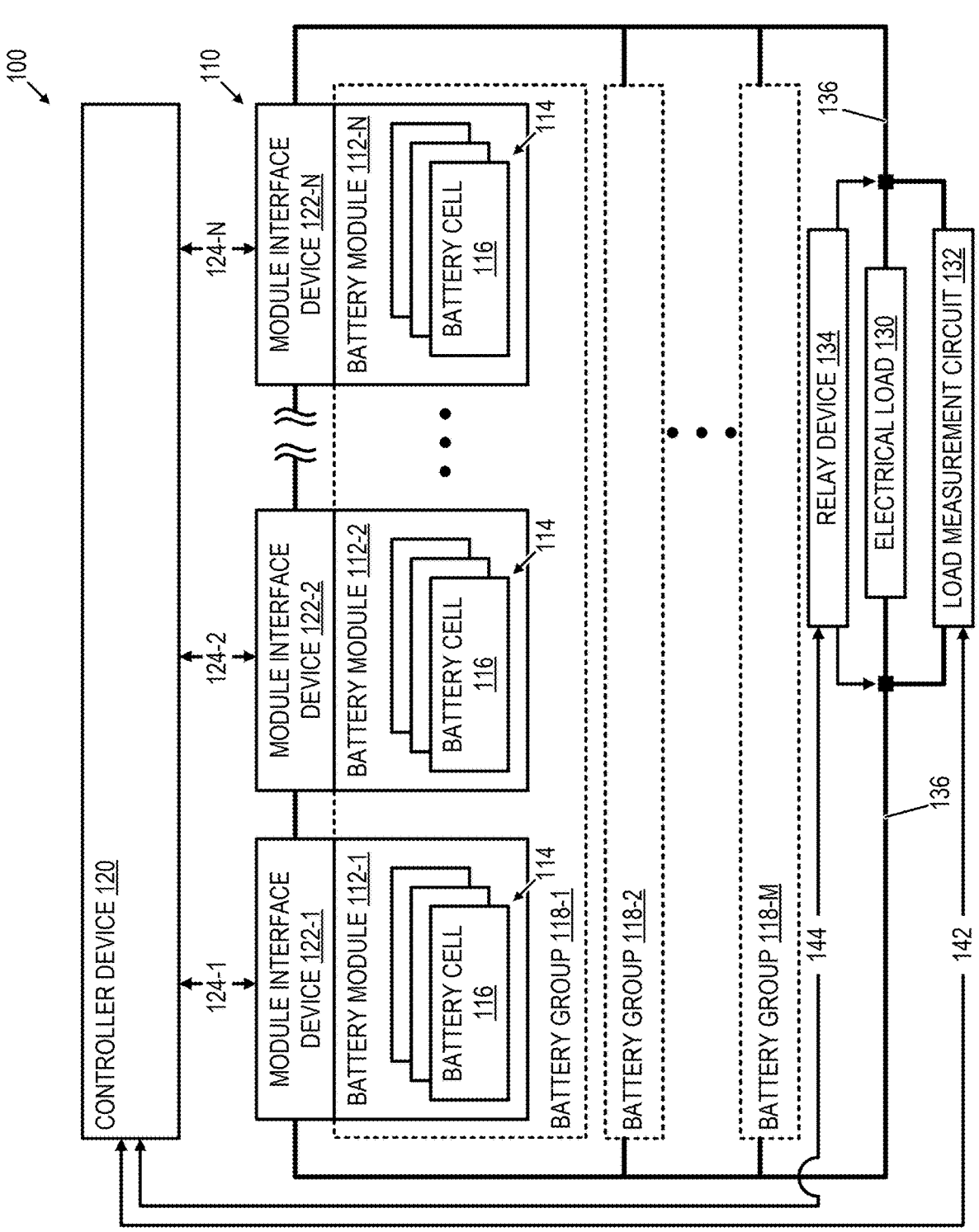
FIG. 1 is a schematic diagram depicting an example battery management system for testing a battery system that includes a plurality of battery modules.

A method, a battery management system, and an article of manufacture for testing a battery system are disclosed that enable testing of individual battery modules and the overall battery system.

As briefly introduced above, significant challenges exist with respect to determining the status of individual battery modules and the overall battery system, particularly within the context of mobile and fixed platforms and/or high voltage installations that incorporate a multi-module battery system. In this context, "status" can refer to operating conditions indicative of health and performance of the individual battery modules and the overall battery system. One challenge associated with determining the status of individual battery modules can be due to high voltages associated with the battery modules while connected within the battery system. For example, high voltage installations can present safety and/or logistical risks to testing. This challenge can be exacerbated within the context of mobile and fixed platforms for which disassembly of the battery system or disconnection of battery modules from the battery system or load is not feasible.

Furthermore, a global problem exists whereby rapidly increasing numbers of high voltage electric-powered vehicles and fixed installations place humans, property, or the environment at risk. Current approaches to battery testing do not provide predictive identification of a degrading or failing module prior to failure. As introduced above, it can be difficult to perform testing that can detect degradation of modules and the installation's health prior to use due to the high power and voltages continuously present in the installation. Existing solutions appear unable to independently test battery modules, particularly within high voltage installations. Instead, checks on battery systems appear to be performed at the full voltage and power levels, and typically the state of charge and open circuit voltage are only verified prior to operation of the battery system within an operational environment or installation.

The disclosed method, battery management system, and article of manufacture for testing a battery system offers the potential to address challenges associated with determining the status of individual battery modules and the overall battery system, enabling health, performance, and other operating conditions to be measured. The approaches described herein provide the ability to independently operate, measure, and test individual modules of a multi-module battery system as part of a test process. The test process can be used for partial (in-process) and complete battery installations to measure various operating conditions associated with the battery modules and associated electrical load, and to provide test results that compare measured values to associated criteria. The approaches described herein offer the ability to electrically connect, disconnect, or otherwise bypass individual battery modules from an installation without direct human involvement. For example, the test process can be performed without physical disconnection, through human interaction, of any battery module from the battery system, electrical load, or installation, and without disassembling the battery system. This capability allows for human safe testing at lower voltage and controlled power levels associated with individual battery modules. The test process can enable detection of degraded or failing battery modules or installations prior to use of the battery system or prior to continued use of the battery system.

FIG. 1 is a schematic diagram depicting an example battery management system 100 for testing a battery system that includes a plurality of battery modules. In FIG. 1, an example battery system 110 includes at least a first battery module 112-1 and a second battery module 112-2. Battery system 110 can further include one or more additional battery modules, depicted in FIG. 1 as battery module 112-N, in which "N" can be any suitable quantity of battery modules.

Each battery module of battery system 110 includes a set of battery cells 114 that includes one or more battery cells, an example of which is depicted as battery cell 116. In at least some examples, each battery module can include a plurality of battery cells of any suitable quantity, including tens, hundreds, or more battery cells, as an example.

The plurality of battery modules of battery system 110 can be arranged in a series configuration, in a parallel configuration, or in a combination of a series configuration and a parallel configuration with respect to an electrical load 130. In the example depicted in FIG. 1, battery modules 112-1, and 112-2 through 112-N are arranged in a series configuration to form a battery group 118-1. Battery system 110 can include a plurality of battery groups arranged in a parallel configuration with respect to electrical load 130 in which each battery group includes one or more battery modules. For example, in FIG. 1, battery groups 118-2 through 118-M are depicted, in which "M" can be any suitable quantity of battery groups. In another example, battery modules 112-2 through 112-N can be included in different battery groups arranged in parallel with battery group 118-1 that includes at least battery module 112-2. For example, battery module 112-2 can form part of battery group 118-2, and battery group 112-N can form part of battery group 118-M. Accordingly, it will be understood that the plurality of battery modules of battery system 100 can include any suitable arrangement of battery modules with respect to electrical load 130.

Battery management system 100 includes a controller device 120 and a plurality of module interface devices 122-1 through 112-N that are operatively coupled to the controller device vian electrical connections 124-1 through 124-N, respectively. Aspects of controller device 110 are described in further detail herein with reference to subsequent figures.

For each battery module of the plurality of battery modules of battery system 110, a respective module interface device of the plurality of module interface devices 122-1 through 112-N of battery management system 100 is operatively coupled to or is configured to be operatively coupled to anode and cathode terminals of that battery module, as described in further detail with reference to FIG. 2. Accordingly, battery management system 100 can include a module interface device for each battery module of battery system 110. In the example of FIG. 1, battery management system 100 includes a first module interface device 122-1 that is operatively coupled to anode and cathode terminals of battery module 112-1, and a second module interface device 122-2 that is operatively coupled to anode and cathode terminals of battery module 112-2. For each additional battery module of battery system 110, represented by battery module 112-N, battery management system 110 includes an additional module interface device, represented by module interface device 122-N.

As described in further detail with reference to FIG. 2, each module interface device 122-1 through 122-N of battery management system 100 includes a measurement circuit and a switching circuit. The measurement circuit of each module interface device can be used by controller device 120 to independently measure one or more operating conditions of the battery module with which that module interface device is operatively coupled. Operating conditions of battery modules are referred to herein as module-specific operating conditions, which can be measured as module-specific measurements. Examples of module-specific operating conditions that can be measured by the measurement circuit of the module interface device include an electrical voltage and an electrical current between or across the anode and cathode of the battery module.

The switching circuit of each module interface device can be used by controller device 120 to connect and disconnect the battery module with respect to electrical load 130. For example, controller device 120 can independently disconnect first battery module 112-1 from electrical load 130 and can independently connect first battery module 112-1 to electrical load 130 via the switching circuit of module interface device 122-1, and controller device 120 can independently measure one or more operating conditions of first battery module 112-1 via the measurement circuit of module interface device 122-1. As another example, controller device 120 can independently disconnect second battery module 112-2 from electrical load 130 and can independently connect second battery module 112-2 to electrical load 130 via the switching circuit of module interface device 122-2, and controller device 120 can independently measure one or more operating conditions of second battery module 112-2 via the measurement circuit of module interface device 122-2.

In at least some examples, electrical load 130 takes the form of a test electrical load that forms part of battery management system 100. In such examples, electrical load 130, as a test load, can be used to implement a test process with respect to battery system 110 prior to interfacing the battery system with another system or device that is to be powered by the battery system. In other examples, electrical load 130 can form part of another system or device that is to be powered by battery system 110 during an operational phase or state of that system or device. The test process described herein can be performed as part of a testing phase that is performed prior to, during, or after the operational phase or state of the system or device that utilizes battery system 110 as a source of electrical energy.

Battery management system 100 can further includes a load measurement circuit 132 and a relay device 134 that can be used by controller device 120 to measure operating conditions across electrical load 130 within a power delivery circuit 136. Such operating conditions are referred herein to as load-specific operating conditions that can be measured as load-specific measurements. As an example, the one or more load-specific operating conditions can include an electrical voltage and/or an electrical current between high and low sides of the electrical load.

Power delivery circuit 136, depicted schematically in FIG. 1, includes various electrical pathways that operatively couple electrical load 130 to the plurality of module interface devices 122-1 through 122-N for the delivery or transfer of electrical power, which in turn are operatively coupled with the plurality of battery modules 112-1 through 112-N according to any suitable series and/or parallel configuration. Relay device 134 can be used by controller device 120 in combination with load measurement circuit 132 to measure the operating conditions across electrical load 130, for example, by relay device 134 being controlled to connect or disconnect load measurement circuit 132 from power delivery circuit 136 on high and low sides of electrical load 130. Within FIG. 1, electrical connections 142 and 144 operatively couple controller device 120 with load measurement circuit 132 and relay device 134, respectively.

Figure 2:
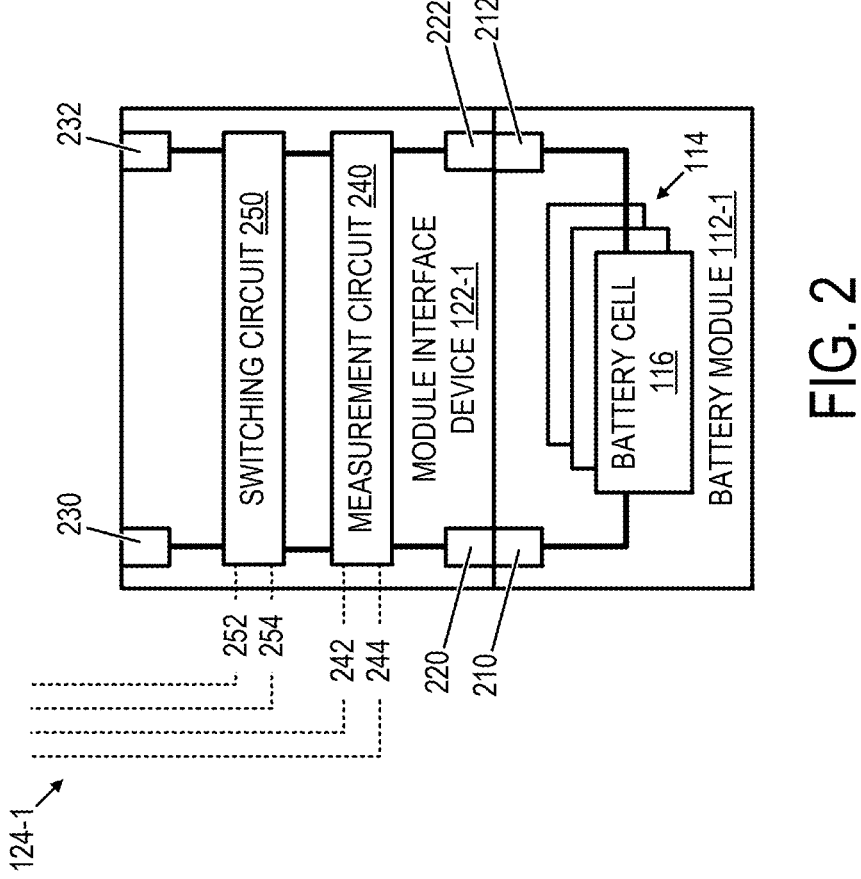
FIG. 2 is a schematic diagram depicting additional aspects of an example module interface device of FIG. 1.

FIG. 2 is a schematic diagram depicting additional aspects of the module interface devices of FIG. 1, described with reference to module interface device 122-1 operatively coupled to battery module 112-1. While module interface device 122-1 and battery module 112-1 of FIG. 2 are used to describe additional aspects of the module interface devices of FIG. 1, each module interface device of battery management system 100, including module interface devices 122-2 through 122-N can have the same configuration and components as module interface device 122-1 of FIG. 2. Similarly, each battery module that is operatively coupled to battery management system 100 of FIG. 1, including battery modules 112-2 through 112-N can have the same or similar configuration and components as battery module 112-1 of FIG. 2. However, in at least some examples, the battery modules can have a different quantity and/or performance rating (e.g., voltage and/or current) of battery cells among some or all of battery modules 112-1, and 112-2 through 112-N.

In FIG. 2, battery module 112-1 includes a cathode terminal 210 and an anode terminal 212. Each battery module of battery system 110 of FIG. 1, including battery modules 112-2 through 112-N similarly include a cathode terminal and an anode terminal.

Module interface device 122-1 includes a module-side cathode interface 220 by which the module interface device is operatively coupled or configured to be operatively coupled to cathode terminal 210 of battery module 112-1. Module interface device 122-1 includes a module-side anode interface 222 by which the module interface device is operatively coupled or configured to be operatively coupled to anode terminal 212 of battery module 112-1. Each of module interface devices 122-2 through 122-N of FIG. 1 similarly include an instance of module-side cathode interface 220 and an instance of module-side anode interface 222 by which the module interface device is operatively coupled to or configured to be operatively coupled to respective cathode and anode terminals of a respective battery module.

Module interface device 122-1 further includes an electrical load-side cathode interface 230 by which the module interface device is operatively coupled to or configured to operatively coupled to an electrical load, such as electrical load 130 of FIG. 1. Module interface device 122-1 further includes an electrical load-side anode interface 232 by which the module interface device is operatively coupled to or configured to operatively coupled to an electrical load, such as electrical load 130 of FIG. 1. Each of module interface devices 122-2 through 122-N of FIG. 1 similarly include an instance of load-side cathode interface 230 and an instance of load-side anode interface 232 by which the module interface device is operatively coupled to or configured to be operatively coupled to the electrical load.

Module interface device 122-1 further includes a measurement circuit 240 and a switching circuit 250, an example of which is described in further detail with reference to FIG. 4. Each of module interface devices 122-2 through 122-N of FIG. 1 similarly include an instance of measurement circuit 240 and switching circuit 250, as described in further detail herein.

Measurement circuit 240 of each module interface device is operable by controller device 120 of FIG. 1 to independently measure one or more module-specific operating conditions of the battery module to which the module interface device is operatively coupled to obtain one or more module-specific measurements. As an example, measurement circuit 240 of module interface device 122-1 is operable by controller device 120 of FIG. 1 to independently measure one or more module-specific operating conditions of battery module 112-1. An example of a module-specific operating condition includes an electrical voltage between or across cathode terminal 210 and anode terminal 212, in which case the module-specific measurement can take the form of an electrical voltage value. Another example of a module-specific operating condition includes an electrical current between or across cathode terminal 210 and anode terminal 212, in which case the module-specific measurement can take the form of an electrical current value. Controller device 120 can control measurement circuit 240 and can receive module-specific measurements from the measurement circuit via one or more of electrical connections 124-1 of FIG. 1, examples of which are schematically depicted in FIG. 2 as electrical connections 242 and 244. Controller device 120 can similarly control and receive module-specific measurements from instances of measurement circuit 240 of other module interface devices 122-2 through 122-N via one or more of electrical connections 124-2 through 124-N of FIG. 2.

Switching circuit 250 of each module interface device is operable by controller device 120 of FIG. 1 to independently connect and disconnect, with respect to the electrical load, the battery module to which that module interface device is operatively coupled to the cathode and anode terminals of that battery module. As an example, switching circuit 250 of the module interface device 122-1 is operable by controller device 120 to independently connect battery module 112-1 from a disconnected state to a connected state with respect to electrical load 130 of FIG. 1. In this example, switching circuit 250 can independently connect the battery module to the electrical load by establishing an electrical connection between cathode terminal 210 of the battery module and load-side cathode interface 230 of the module interface device, and by establishing an electrical connection between anode terminal 212 of the battery module and load-side anode interface 232 of the module interface device. As another example, switching circuit 250 of module interface device 122-1 is operable by controller device 120 to independently disconnect battery module 112-1 from a connected state to a disconnected state with respect to electrical load 130 of FIG. 1. In this example, switching circuit 250 can independently disconnect the battery module from the electrical load by decoupling an electrical connection between cathode terminal 210 of the battery module and load-side cathode interface 230 of the module interface device, and by decoupling an electrical connection between anode terminal 212 of the battery module and load-side anode interface 232 of the module interface device. Controller device 120 can control switching circuit 250 of module interface device 122-1 via one or more of electrical connections 124-1 of FIG. 1, examples of which are schematically depicted in FIG. 2 as electrical connections 252 and 254. Controller device 120 can similarly control instances of switching circuit 250 of other module interface devices 122-2 through 122-N via one or more of electrical connections 124-2 through 124-N of FIG. 2.

FIGS. 3A and 3B are flow diagram depicting an example method 300 for testing a battery system that includes a plurality of battery modules. Battery system 110 of FIG. 1 is an example of a battery system that can be tested by performing method 300. As an example, method 300 for testing the battery system can be performed via battery management system 100 of FIG. 1, which includes controller device 120 and, for each battery module of the plurality of battery modules, a respective module interface device that is operatively coupled to anode and cathode terminals of that battery module. For example, method 300 and the various operations of the method for testing the battery system can be performed by controller device 120 of FIG. 1.

Referring to FIG. 3A, at 310, the method includes receiving a control input initiate and perform a test process. As an example, a user can provide a control input via a user interface that is received by the controller device of the battery management system. The test process can be initiated and performed by the controller device responsive to the control input.

At 312, the method includes performing the test process 302 with respect to the battery system. As previously described, the test process 302 can be performed at or by the controller device (e.g., 110 of FIG. 1) of the battery management system.

At 314, the method includes independently disconnecting each battery module of the plurality of battery modules from a connected state to a disconnected state with respect to an electrical load via a switching circuit of the module interface device that is operatively coupled to the cathode and anode terminals of that battery module. As an example, the switching circuit can refer to switching circuit 250 of FIG. 2.

At 316, the method includes, while the plurality of battery modules are in the disconnected state, independently measuring one or more module-specific operating conditions of each battery module of the plurality of battery modules via a measurement circuit of the module interface device that is operatively coupled to the cathode and anode terminals of that battery module to obtain one or more module-specific measurements for each module-specific operating condition. As an example, the measurement circuit can refer to measurement circuit 240 of FIG. 2. Module-specific measurements that are obtained for a battery module that is in a disconnected state can be referred to as disconnected module-specific measurements. Examples of module-specific operating conditions include an electrical voltage and an electrical current measured between or across cathode and anode terminals of the battery module. In at least some examples, the one or more module-specific measurements obtained at 316 for each battery module in the connected state can include a plurality of measurements obtained for the module-specific operating condition(s) over a period of time.

At 318, the method includes, while each (all) of the plurality of battery modules are in the disconnected state, measuring one or more load-specific operating conditions across the electrical load to obtain one or more load-specific measurements for each load-specific operating condition. Load-specific measurements that are obtained while the plurality of battery modules are in the disconnected state can be referred to as disconnected load-specific measurements. Examples of load-specific operating conditions include an electrical voltage and an electrical current measured across the electrical load. In at least some examples, the one or more load-specific measurements obtained at 318 while the plurality of battery modules are in the disconnected state can include a plurality of measurements obtained for the load-specific operating condition(s) over a period of time.

As part of operation 318, the method at 320 can further include controlling a relay device (e.g., 134 of FIG. 1) of the battery management system for measuring the load-specific operation condition. For example, the relay device can be controlled by the controller device to operatively couple a load measurement circuit (e.g., 132 of FIG. 1) and/or a test load (e.g., 130 of FIG. 1.) as part of the test process.

At 322, the method includes performing module-specific testing of the plurality of battery modules of the battery system. As part of module-specific testing performed at 322, each battery module of the plurality of battery modules can be independently connected with respect to the electrical load for testing while the remaining battery modules of the plurality of battery modules are in the disconnected state. A battery module for which module-specific testing is performed at operation 322 can be referred to as a subject battery module. As subsequently described, operations 324-334 can be performed for each subject battery module of the plurality of battery modules as part of module-specific testing performed at 322.

At 324, the method includes, for each battery module of the plurality of battery modules, independently connecting that battery module from the disconnected state to the connected state with respect to the electrical load via the switching circuit of the module interface device that is operatively coupled to the cathode and anode terminals of that battery module while remaining battery modules of the plurality of battery modules are in the disconnected state. For example, the controller device can command the switching circuit of the module interface of the subject battery module to connect the battery module to the electrical load. The battery module that is connected at 324 while the remaining batteries are in the disconnected state can be referred to as the subject battery module.

At 326, the method includes, for each battery module of the plurality of battery modules, independently measuring the one or more module-specific operating conditions of that battery module in the connected state via the measurement circuit of the module interface device that is operatively coupled to the cathode and anode terminals of that battery module to obtain one or more module-specific measurements while the remaining battery modules are in the disconnected state. For example, the controller device can obtain one or more module-specific measurements of each module-specific operating condition for the subject battery module via the measurement circuit. Module-specific measurements that are obtained for a subject battery module that is in the connected state can be referred to as connected module-specific measurements. As previously described, examples of module-specific operating conditions include an electrical voltage and an electrical current measured between or across cathode and anode terminals of the battery module. In at least some examples, the one or more module-specific measurements obtained at 326 for each battery module in the connected state can include a plurality of measurements obtained for the module-specific operating condition(s) over a period of time.

At 328, the method includes, for each battery module of the plurality of battery modules of the battery system, measuring the one or more load-specific operating conditions across the electrical load to obtain one or more load-specific measurements while that battery module is in the connected state and the remaining battery modules are in the disconnected state. Load-specific measurements that are obtained while a battery module is in the connected state can be referred to as connected load-specific measurements. As previously described, examples of load-specific operating conditions include an electrical voltage and an electrical current measured across the electrical load. As part of operation 328, the method at 330 can include controlling a relay device (e.g., 134 of FIG. 1) for measuring the load-specific operating conditions. For example, the controller device can obtain the load-specific measurement via a load measurement circuit (e.g., 132 of FIG. 1) associated with the relay device, as previously described with reference to operation 320. In at least some examples, the one or more load-specific measurements obtained at 328 for each battery module in the connected state can include a plurality of measurements obtained for the load-specific operating condition over a period of time.

At 332, the method includes disconnecting each battery module of the plurality of battery modules from the connected state to the disconnected state with respect to the electrical load. For example, the controller device can disconnect the subject battery module for which module-specific testing was performed at 322 via the switching circuit of the module interface device operatively coupled to the subject battery module.

As depicted schematically at 334, module specific-testing can be performed for each battery module of the plurality of battery modules by repeating operations 324-332 for another battery module as the subject battery module.

At 336, the method includes processing the measurements obtained at operations 316, 318, 326, and 328 to determine a set of test results. FIG. 3B depicts additional aspects of operation 336 in which measurements are processed to determine a set of test results. Referring to FIG. 3B, some or all of operations 350 through 380 can be performed as part of processing the measurements to determine the set of test results at operation 336.

At 350, the method can include, for each battery module of the plurality of battery modules, computing one or more test results based on the disconnected module-specific measurements obtained at operation 316. As an example, where the disconnected module-specific measurements include measurements of electrical voltage and electrical current, the test results computed at 350 can include a power of each battery module in the disconnected state that is based on the measurements of electrical voltage and electrical current. Additionally, or alternatively, the test results computed at 350 can include a rate of change of electrical voltage, electrical current, or power measured over time.

At 352, the method can include, for each battery module of the plurality of battery modules, computing one or more test results based on the connected module-specific measurements obtained at operation 326. As an example, where the connected module-specific measurements include measurements of electrical voltage and electrical current, the test results computed at 352 can include a power of each battery module in the connected state that is based on the measurements of electrical voltage and electrical current obtained while the remaining battery modules are in the disconnected state. Additionally, or alternatively, the test results computed at 352 can include a rate of change of electrical voltage, electrical current, or power measured over time.

At 354, the method can include computing one or more test results based on the disconnected load-specific measurements obtained at operation 318 while the plurality of battery modules were in the disconnected state. As an example, where the disconnected load-specific measurements include measurements of electrical voltage and electrical current, the test results computed at 354 can include a power delivered to the load while the plurality of battery modules were in the disconnected state that is based on the measurements of electrical voltage and electrical current. Additionally, or alternatively, the test results computed at 354 can include a rate of change of electrical voltage, electrical current, or power measured over time.

At 356, the method can include computing one or more test results based on the connected load-specific measurements obtained at operation 328 for each battery module in the connected state while the plurality of battery modules were in the disconnected state. As an example, where the connected load-specific measurements include measurements of electrical voltage and electrical current, the test results computed at 356 can include a power delivered to the load while the subject battery module was in the connected state that is based on the measurements of electrical voltage and electrical current. Additionally, or alternatively, the test results computed at 356 can include a rate of change of electrical voltage, electrical current, or power measured over time.

At 358, the method can include, for each battery module of the plurality of battery modules, comparing the one or more disconnected module-specific measurements obtained at 316 and/or the one or more test results computed at 350 to module criteria to obtain one or more test results. The module criteria can define one or more thresholds and/or one or more target values for each module-specific operating condition that is measured at 316 and/or test results computed at 350. As an example, the comparisons performed at 358 can include applying one or more thresholds at 360 and/or applying one or more target values at 362 of the module criteria to the one or more disconnected module-specific measurements of each battery module measured at 316 and/or test results obtained at 350 to obtain one or more test results for that battery module. The one or more thresholds and/or one or more target values can delineate an acceptable operating range or value from an unacceptable operating range or value. The test results obtained at 358 can include an indication of whether the one or more disconnected module-specific measurements obtained at 316 and/or the test results obtained at 350 for each battery module meets the module criteria—e.g., whether the one or more measurements are at or within the acceptable operating range or value.

At 364, the method can include, for each battery module of the plurality of battery modules, comparing the one or more connected module-specific measurements obtained at 326 and/or the one or more test results computed at 352 to module criteria to obtain one or more test results. As an example, the comparisons performed at 364 can include applying one or more thresholds at 366 and/or applying one or more target values at 368 of the module criteria to the one or more connected module-specific measurements of each battery module measured at 326 and/or test results obtained at 352 to obtain one or more test results for that battery module. As previously described, the one or more thresholds and/or one or more target values can delineate an acceptable operating range or value from an unacceptable operating range or value. The test results obtained at 364 can include an indication of whether the one or more connected module-specific measurements obtained at 326 and/or the test results obtained at 352 for each battery module meets the module criteria—e.g., whether the one or more measurements are at or within the acceptable operating range or value.

At 370, the method can include, comparing the one or more disconnected load-specific measurements obtained at 318 and/or the one or more test results computed at 354 to load criteria to obtain one or more test results. The load criteria can define one or more thresholds and/or one or more target values for each load-specific operating condition that is measured at 318 and/or test results computed at 354. As an example, the comparisons performed at 370 can include applying one or more thresholds at 372 and/or applying one or more target values at 374 of the load criteria to the one or more disconnected load-specific measurements measured at 318 and/or test results calculated at 354 to obtain one or more test results. The one or more thresholds and/or one or more target values can delineate an acceptable operating range or value from an unacceptable operating range or value. The test results obtained at 370 can include an indication of whether the one or more disconnected load-specific measurements obtained at 318 and/or the test results obtained at 354 meets the load criteria—e.g., whether the one or more measurements are at or within the acceptable operating range or value.

At 376, the method can include, for each battery module in the connected state while the remaining battery modules are in the disconnected state, comparing the one or more connected load-specific measurements obtained at 328 and/or the one or more test results computed at 356 to load criteria to obtain one or more test results. As previously described, the load criteria can define one or more thresholds and/or one or more target values for each load-specific operating condition that is measured at 328 and/or test results computed at 356. As an example, the comparisons performed at 376 can include applying one or more thresholds at 378 and/or applying one or more target values at 380 of the load criteria to the one or more connected load-specific measurements measured at 328 and/or test results calculated at 356 to obtain one or more test results. As previously described, the one or more thresholds and/or one or more target values can delineate an acceptable operating range or value from an unacceptable operating range or value. The test results obtained at 376 can include an indication of whether the one or more connected load-specific measurements obtained at 328 and/or the test results obtained at 356 meets the load criteria—e.g., whether the one or more measurements are at or within the acceptable operating range or value.

Referring again to FIG. 3A, at 338, the method includes outputting and/or storing the set of test results that includes and/or is based on one or more of the measurements that were obtained by method 300, including some or all of the test results determined at operation 336 of FIG. 3B. For example, the set of test results can include the measurements obtained at 316, 318, 326, and 328 of method 300. Additionally or alternatively, as an example, the set of test results output and/or stored at 338 can be based on one or more of: (1) the module-specific measurements (connected module-specific measurements) obtained for each battery module of the plurality of battery modules obtained while that battery module is in the connected state and the remaining battery modules are in the disconnected state, (2) the load-specific measurements (connected load-specific measurements) for each battery module of the plurality of battery modules obtained while that battery module is in the connected state and the remaining battery modules are in the disconnected state, (3) load-specific measurements (disconnected load-specific measurements) obtained while each of the plurality of battery modules is in the disconnected state, and (4) module-specific measurements (disconnected module-specific measurements) obtained for each battery module while each of the plurality of battery modules is in the disconnected state.

Accordingly, in an example implementation of method 300, the load-specific operating condition includes an electrical voltage or an electrical current, and the load criteria compared to the disconnected load-specific measurements includes a target value of zero voltage or zero current. As another example, the module criteria includes a target value of zero voltage or zero current when disconnected from the load, and the set of test results indicates whether the module-specific measurement is zero voltage or zero current. As another example, the set of test results includes an indication whether, for each battery module of the set of battery modules, the module-specific measurement obtained for that battery module matches the load-specific measurement obtained while that battery module is in the connected state and the remaining battery modules are in the disconnected state. For example, the set of test results includes an indication whether an electrical current or an electrical voltage of a battery module is within an acceptable operating range as defined by one or more thresholds. As another example, the set of test results includes an indication whether a rate of change of an electrical current or an electrical voltage of a battery module is within an acceptable operating range as defined by one or more thresholds.

Figure 4:
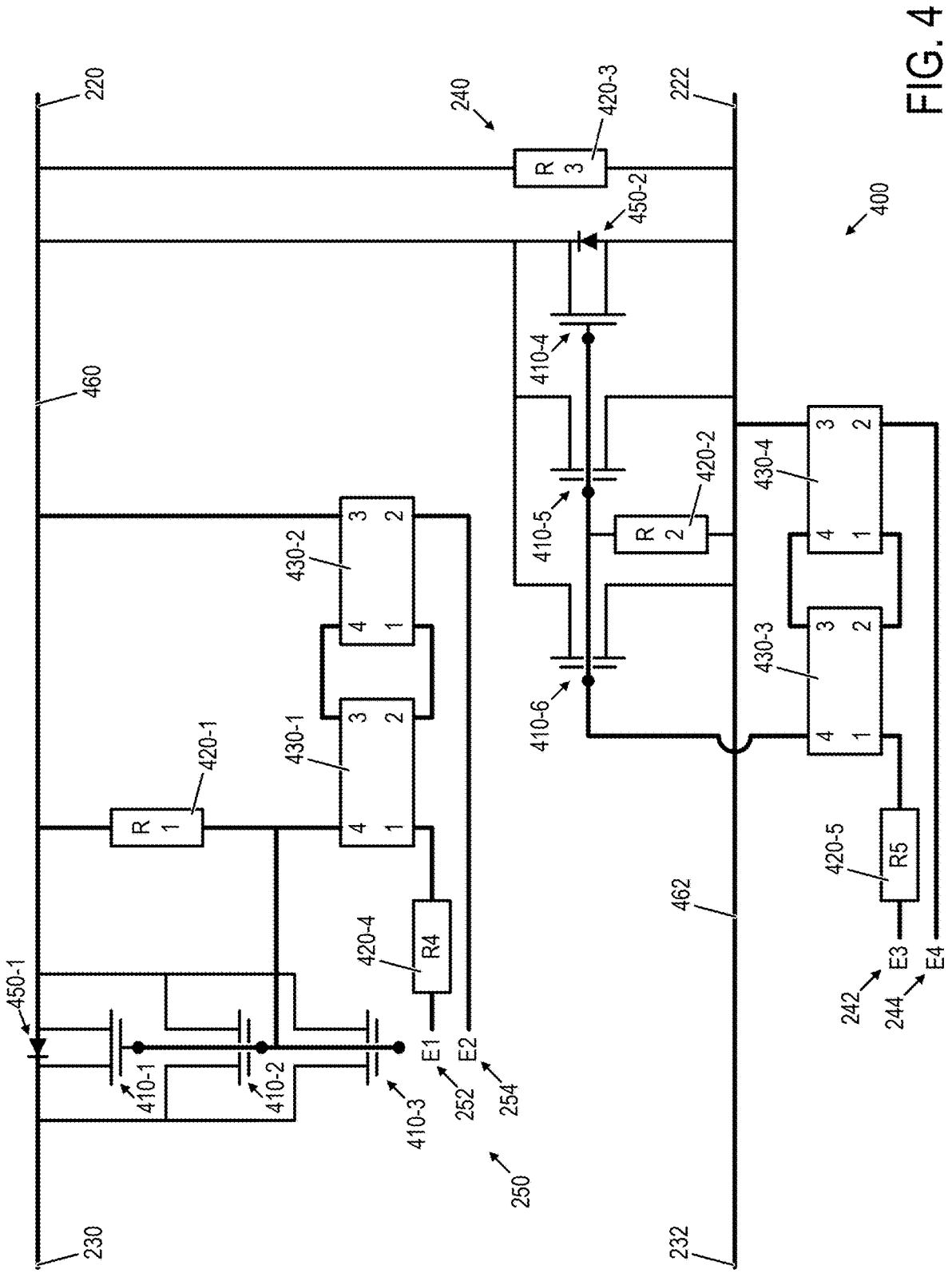
FIG. 4 is a schematic diagram depicting an example circuit that can form part of the module interface device.

FIG. 4 is a schematic diagram depicting an example circuit 400 that can form part of each module interface device of battery manage system 100 of FIG. 1, including module interface devices 122-1, and 122-2 through 122-N. Circuit 400 includes examples of module-side cathode interface 220, module-side anode interface 222, electrical load-side cathode interface 230, electrical load-side anode interface 232, measurement circuit 240, and switching circuit 250 of FIG. 2.

In the example of FIG. 4, circuit 400 includes a set of electrical components, including six transistors 410-1, 410-2, 410-3, 410-4, 410-5, 410-6, five resistors 420-1, 420-2, 420-3, 420-4, 420-5, four optical isolators 430-1, 430-2, 430-3, 430-4, two diodes 450-1, 450-2 interconnected via electrical pathways. It will be understood that circuit 400 can take any suitable form and can include a different quantity and configuration of electrical components from the example depicted in FIG. 4 to implement the functions of measurement circuit 240 and switching circuit 250.

In FIG. 4, example locations of module-side cathode interface 220, module-side anode interface 222, electrical load-side cathode interface 230, electrical load-side anode interface 232 of FIG. 2 are schematically depicted within circuit 400. It will be understood that cathode and anode locations can be reversed in some examples of circuit 400.

Circuit 400 includes an electrical pathway 460 that spans module-side cathode interface 220 and electrical load-side cathode interface 230. Circuit 400 further includes an electrical pathway 462 that spans module-side anode interface 222 and electrical load-side anode interface 232.

In the example of FIG. 4, measurement circuit 240 includes resistor 420-3 across which electrical current and/or electrical voltage can be measured, as examples of module-specific operating conditions that can be measured via measurement circuit 240, as described herein. In at least some examples, measurement circuit 240 can further include the electrical load (e.g., 130, such as a test load) and a disconnect circuit (e.g., relay device 134). Furthermore, in the example of FIG. 4, switching circuit 250 includes the module interface (e.g., 122-1, 122-2 through 122-N).

FIG. 5 depicts a first view of an example configuration 500 of each module interface device of module interface devices 122-1, and 122-2 through 122-N of FIG. 1. The first view of FIG. 5 shows a first side of configuration 500.

Example configuration 500 of each module interface device includes a device body 510, which can define one or more through-holes or apertures 512-1, 512-2, 512-3, 512-4, 512-5 by which the module interface device can be mounted to a battery module (e.g., 112-1, 112-2 through 112-N) via respective fasteners.

Configuration 500 of each module interface device includes electrical conductors 560-1 and 560-2 that span module-side cathode interface 220 and electrical load-side cathode interface 230. Electrical conductors 560-1 and 560-2 are an example of electrical pathway 460 of FIG. 4. Configuration 500 of each module interface device further includes an electrical conductor 562 that spans module-side anode interface 222 and electrical load-side anode interface 232. Electrical conductor 562 is an example of electrical pathway 462 of FIG. 4.

Within FIG. 5, a region 520 is depicted that contains resistors 420-1, 420-2, 420-4, 420-5, optical isolators 430-1, 430-2, 430-3, 430-4, and diodes 450-1, 450-2. FIG. 5 further depicts a region 522 that contains resistor 420-3 across which electrical current and/or electrical voltage can be measured. Example locations of transistors 410-1, 410-2, 410-3, 410-4, 410-5, 410-6 are also schematically depicted in FIG. 4.

FIG. 6 depicts a second view of the example configuration 500 of FIG. 5. The second view of FIG. 6 shows an edge of configuration 500. FIG. 6 further depicts an example of configuration 500 being housed in an enclosure 600, depicted schematically in FIG. 6.

FIG. 7 depicts a third view of the example configuration of the module interface device of FIG. 5. The third view of FIG. 7 shows a second side of configuration 500, opposite the first side shown in FIG. 5.

In at least some examples, the methods and operations described herein can be performed by a computing system of one or more computing devices. In particular, such methods and operations may be implemented as a computer-application program or service, an application-programming interface (API), a library, and/or other computer-program product.

Figure 8:
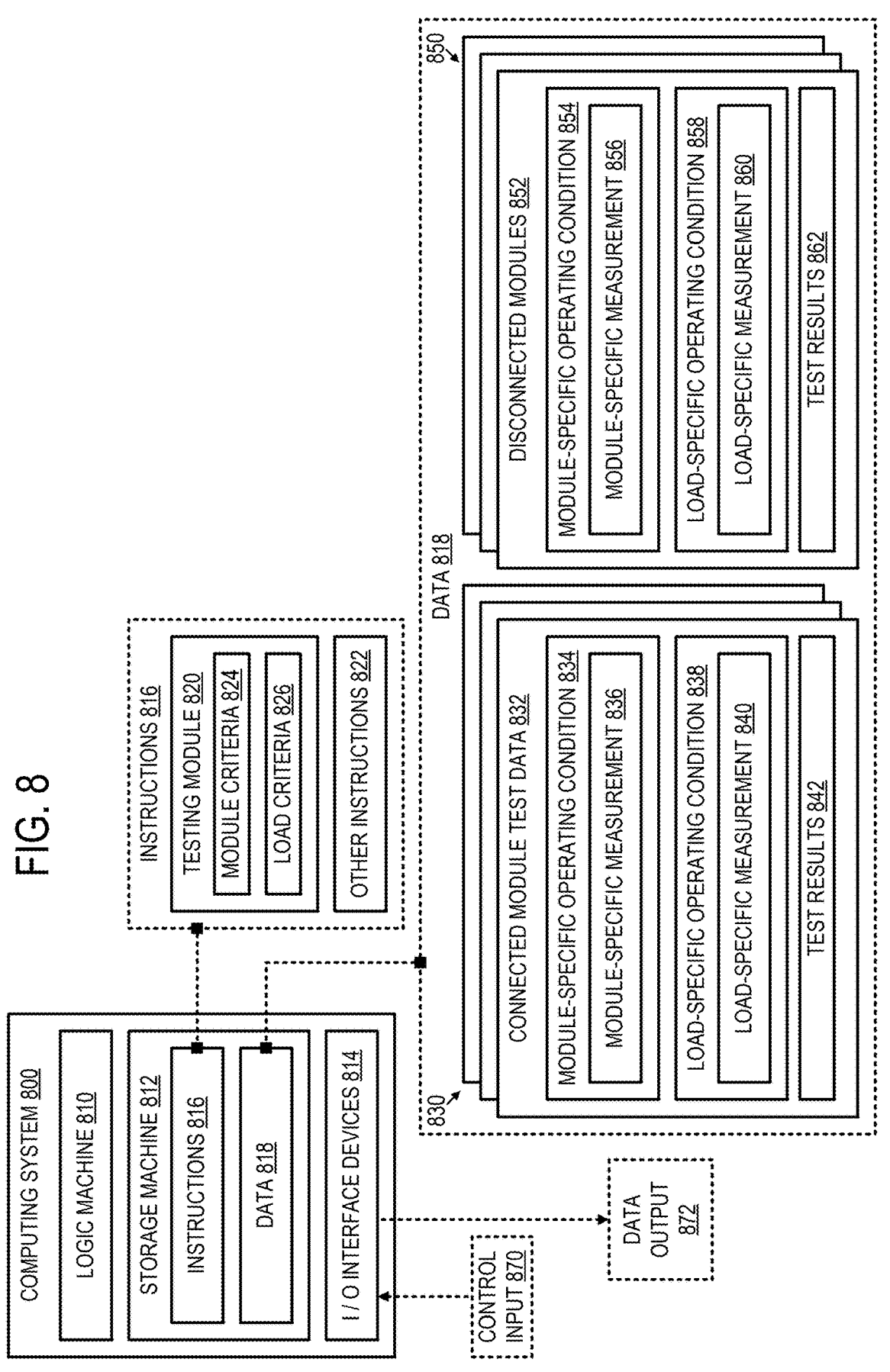
FIG. 8 is a schematic diagram depicted an example computing system that can form part of a controller device.

FIG. 8 schematically depicts an example computing system 800 that is configured to perform the methods and operations described herein. Computing system 800 can form part of controller device 120 of FIG. 1. Computing system 800 is shown in simplified form in FIG. 8. Computing system 800 can take the form of one or more personal computers, server computers, network computers, mobile computers, and/or other computing devices.

Computing system 800 includes a logic machine 810, a storage machine 812, and one or more input/output (I/O) interface devices. Computing system 800 can include other components not shown in FIG. 8.

Logic machine 810 includes one or more physical logic devices configured to execute instructions. For example, logic machine 810 can be configured to execute instructions 816 that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

Logic machine 810 can include one or more processor devices configured to execute software instructions. Additionally, or alternatively, logic machine 810 can include one or more hardware or firmware logic machines configured to execute hardware or firmware instructions. Processor devices of the logic machine can be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of logic machine 810 can be virtualized and executed by remotely accessible, networked computing devices configured in a cloud-computing configuration.

Storage machine 812 includes one or more physical storage devices configured to hold instructions 816 and other data 818 executable by logic machine 810 to perform or otherwise implement the methods and operations described herein. When such methods and operations are performed or otherwise implemented, the state of storage machine 812 may be transformed—e.g., to hold different data.

Storage machine 812 can include removable and/or built-in storage devices. Storage machine 812 can include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 812 can include volatile, nonvolatile, dynamic, static, read/write, read-only, random-access, sequential-access, location-addressable, file-addressable, and/or content-addressable devices.

It will be appreciated that storage machine 812 includes one or more physical storage devices. However, aspects of instructions 816 described herein alternatively may be propagated by a communication medium (e.g., an electromagnetic signal, an optical signal, etc.) that is not held by a physical device for a finite duration in some conditions or states.

Aspects of logic machine 812 and storage machine 810 can be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 800 implemented to perform a particular function. In some cases, a module, program, or engine may be instantiated via logic machine 810 executing instructions 816 held by storage machine 812. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

FIG. 8 further depicts aspects of instructions 816 and data 818. In the example of FIG. 8, instructions 816 include a testing module 820 that is executable by logic machine 810 to perform method 300 of FIGS. 3A and 3B, including the testing process described herein. Instructions 816 can include other instructions 822 in addition to testing module 820. Testing module 820, as an example of instructions 816, includes module criteria 824 and load criteria 826. Module-specific measurements obtained via measurement circuits of the module interface devices described herein can be compared to module criteria 824 by testing module 820 as part of determining a set of test results, as previously described with reference to FIG. 3B. In at least some examples, the module criteria can differ for some or all of the battery modules of the plurality of battery modules to accommodate battery modules having different performance ratings and/or configurations (e.g., different electrical voltage, electrical current, and/or power).

Load criteria 826 can define a target value that is compared to a load-specific measurement obtained via load measurement circuit 132 of FIG. 1, and a test result generated by testing module 820 can include an indication of whether the load-specific measurement meets the load criteria. As an example, the load-specific operating condition includes at least one of an electrical voltage or an electrical current measured across the electrical load. For example, where each of the battery modules are to be in the disconnected state, the load criteria can include zero voltage or zero current as the target load-specific measurement for comparison to the load-specific measurement. Where a particular battery module is to be in the connected state while the remaining battery modules are in the disconnected state, the load criteria can include a target voltage or target current that is to be provided by the connected battery module, as another example.

FIG. 8 further depicts an example of data 818. In this example, data 818 includes a set of connected module test data 830 that includes data representing measurements and test results obtained when a subject battery module is in the connected state and the remaining battery modules of the battery system are in the disconnected state. An example of the set of test data 830 is depicted in FIG. 8 as connected module test data 832 that was obtained while a subject battery module is in the connected state and the remaining battery modules are in the disconnected state. For each subject battery module that is tested in the connected state, at least one module-specific operating condition 834 (e.g., current or voltage) that is measured by the controller device can be represented by at least one module-specific measurement 836 (e.g., a value of current or voltage). Additionally, for each battery module that is tested in the connected state, at least one load-specific operating condition 838 (e.g., current or voltage) that is measured can be represented by at least one load-specific measurement 840 (e.g., a value of current or voltage). Test results 842 of connected module test data 832 can include module-specific measurement 836, load-specific measurement 840, and processed forms of such measurements, such as test results obtained by comparing measurements to module criteria 824 or load criteria 826. An instance of connected module test data 832 can be obtained for each subject battery module that is measured in the connected state while the remaining battery modules are in the disconnected state.

Data 818 further includes a set of disconnected module test data 850 that includes data representing measurements and test results obtained when all battery modules of the battery system are in the disconnected state. An example of the set of test data 850 is depicted in FIG. 8 as connected module test data 852 that was obtained while all battery modules of the battery system are in the disconnected state. For each battery module that is tested in the disconnected state, at least one module-specific operating condition 854 (e.g., current or voltage) that is measured by the controller device can be represented by at least one module-specific measurement 856 (e.g., a value of current or voltage). Additionally, for the disconnected state of the battery modules, at least one load-specific operating condition 858 (e.g., current or voltage) that is measured can be represented by at least one load-specific measurement 860 (e.g., a value of current or voltage). Test results 862 of disconnected module test data 852 can include module-specific measurement 856, load-specific measurement 860, and processed forms of such measurements, such as test results obtained by comparing measurements to module criteria 824 or load criteria 826.

Input/output interface devices 814 can include interface devices that operatively couple the computing system to measurement circuit 240 and switching circuit 250 of each module interface device. Accordingly, input/output interface devices 814 can be used by control system 110 to communicate with battery interface modules 122-1, 122-2 through 122-N of FIG. 1 via electrical connections 124-1, and 124-2 through 124-N. Input/output interface devices 814 can include interface devices that operatively couple the computing system to load measurement circuit 132 via electrical connection 142, and to relay device 134 via electrical connection 144. Additionally, input/output interface devices 814 can include interface devices that operatively couple the computing system to other devices (e.g., periphery devices, computing devices, or other remote devices) or to communications networks (e.g., the Internet and/or a local area network). In at least some examples, input/output interface devices 814 can include periphery devices, such as a graphical display, user input device (e.g., keyboard, mouse, etc.), other input devices, and/or other output devices.

In FIG. 8, computing system 800 is depicted receiving a control input 870 via input/output interface devices 814. Control input 870 can be initiated via another device that is operatively coupled with computing system 800, as an example. Additionally, in FIG. 8, computing system 800 is depicted outputting data, as data output 872. Data output 872 can include any of the data described herein, including data 818, module-specific measurements (e.g., 836, 856), load-specific measurements (e.g., 840, 860), and test results (e.g., 842, 862) that include processed data that is based on the measurements described herein. Data output 872 can include the presentation of data via a graphical display or other output device, as an example. Computing system 800, through execution of testing module 820, can provide data output 872 responsive to receiving control input 870, as an example. In this example, control input 870 can instruct computing system 800 to initiate and perform method 300 of FIGS. 3A and 3B, including the test process described herein.

Further, the disclosure comprises configurations according to the following clauses.

Clause 1. A method for testing a battery system that includes a plurality of battery modules, the method comprising: performing a test process with respect to the battery system via a battery management system that includes a controller device and a plurality of module interface devices; wherein for each battery module of the plurality of battery modules, a respective module interface device of the plurality of module interface devices is operatively coupled to anode and cathode terminals of that battery module; wherein performing the test process includes, at the controller device: independently disconnecting each battery module of the plurality of battery modules from a connected state to a disconnected state with respect to an electrical load via a switching circuit of the module interface device that is operatively coupled to the cathode and anode terminals of that battery module; for each battery module of the plurality of battery modules, independently connecting that battery module from the disconnected state to the connected state with respect to the electrical load via the switching circuit of the module interface device that is operatively coupled to the cathode and anode terminals of that battery module while remaining battery modules of the plurality of battery modules are in the disconnected state; for each battery module of the plurality of battery modules, independently measuring a module-specific operating condition of that battery module in the connected state via a measurement circuit of the module interface device that is operatively coupled to the cathode and anode terminals of that battery module to obtain a module-specific measurement while the remaining battery modules are in the disconnected state; for each battery module of the plurality of battery modules, measuring a load-specific operating condition across the electrical load to obtain a load-specific measurement while that battery module is in the connected state and the remaining battery modules are in the disconnected state; and outputting a set of test results that includes or is based on the module-specific measurement and the load-specific measurement for each battery module of the plurality of battery modules obtained while that battery module is in the connected state and the remaining battery modules are in the disconnected state.

Clause 2. The method of Clause 1, wherein the module-specific operating condition includes an electrical voltage between the anode and cathode terminals of the battery module; and wherein the load-specific operating condition includes an electrical voltage.

Clause 3. The method of any of Clauses 1-2, wherein the module-specific operating condition includes an electrical current between the anode and cathode terminals of the battery module; and wherein the load-specific operating condition includes an electrical current.

Clause 4. The method of any of Clauses 1-3, wherein performing the test process further includes: while each of the plurality of battery modules are in the disconnected state, measuring the load-specific operating condition across the electrical load to obtain an additional load-specific measurement; wherein the set of test results is further based on the additional load-specific measurement.

Clause 5. The method of any of Clauses 1-4, wherein the set of test results include an indication whether the additional load-specific measurement meets a load criteria.

Clause 6. The method of any of Clauses 1-5, wherein the load-specific operating condition includes an electrical voltage or an electrical current; and wherein the load criteria includes a target value of zero voltage or zero current.

Clause 7. The method of any of Clauses 1-6, wherein the set of test results include, for each battery module of the plurality of battery modules, an indication of whether the module-specific measurement meets a module criteria; wherein the module-specific operating condition includes at least one of an electrical voltage or an electrical current measured between the anode and cathode terminals of the battery module; and wherein the module criteria includes a target voltage or a target current.

Clause 8. The method of Clause 7, wherein the module criteria differs for at least some or all of the battery modules of the plurality of battery modules.

Clause 9. The method of any of Clauses 1-8, wherein performing the test process further includes: while the plurality of battery modules are in the disconnected state, independently measuring the module-specific operating condition of each battery module of the plurality of battery modules via the measurement circuit of the module interface device that is operatively coupled to the cathode and anode terminals of that battery module to obtain an additional module-specific measurement; wherein the set of test results is further based on the additional module-specific measurement for each battery module of the plurality of battery modules.

Clause 10. The method of Clause 9, wherein the set of test results include an indication whether the additional module-specific measurement for each battery module of the plurality of battery modules meets a module criteria.

Clause 11. The method of Clause 10, wherein the module-specific operating condition includes an electrical voltage or an electrical current; and wherein the module criteria includes a target value of zero voltage or zero current.

Clause 12. The method of any of Clauses 1-11, wherein the set of test results includes an indication whether, for each battery module of the set of battery modules, whether the module-specific measurement obtained for that battery module matches load-specific measurement obtained while that battery module is in the connected state and the remaining battery modules are in the disconnected state.

Clause 13. The method of any of Clauses 1-12, wherein the test process is performed by the controller device responsive to a control input.

Clause 14. A battery management system for testing a battery system that includes a plurality of battery modules, the battery management system comprising: a controller device; and a plurality of module interface devices operatively coupled to the controller device in which each module interface device includes a measurement circuit and a switching circuit, wherein for each battery module of the plurality of battery modules, a respective module interface device of the plurality of module interface devices is configured to be operatively coupled to anode and cathode terminals of that battery module; wherein the controller device is configured to perform a test process with respect to the battery system that includes: independently disconnecting each battery module of the plurality of battery modules from a connected state to a disconnected state with respect to an electrical load via the switching circuit of the module interface device that is operatively coupled to the cathode and anode terminals of that battery module; for each battery module of the plurality of battery modules, independently connecting that battery module from the disconnected state to the connected state with respect to the electrical load via the switching circuit of the module interface device that is operatively coupled to the cathode and anode terminals of that battery module while remaining battery modules of the plurality of battery modules are in the disconnected state; for each battery module of the plurality of battery modules, independently measuring a module-specific operating condition of that battery module via the measurement circuit of the module interface device that is operatively coupled to the cathode and anode terminals of that battery module to obtain a module-specific measurement while the remaining battery modules are in the disconnected state; for each battery module of the plurality of battery modules of the battery system, measuring a load-specific operating condition across the electrical load to obtain a load-specific measurement while that battery module is in the connected state and the remaining battery modules are in the disconnected state; and outputting a set of test results that includes or is based on the module-specific measurement and the load-specific measurement for each battery module of the plurality of battery modules obtained while that battery module is in the connected state and the remaining battery modules are in the disconnected state.

Clause 15. The battery management system of Clause 14, wherein each module interface device of the plurality of module interface devices includes: a module-side cathode interface by which the module interface device is configured to be operatively coupled to the cathode terminal of the battery module; a module-side anode interface by which the module interface device is configured to be operatively coupled to the anode terminal of the battery module; an electrical load-side cathode interface by which the module interface device is configured to operatively coupled to the electrical load; and an electrical load-side anode interface by which the module interface device is configured to operatively coupled to the electrical load.

Clause 16. The battery management system of any of Clauses 14-15, wherein further comprising: an electrical load measurement circuit operatively coupled to opposing sides of the electrical load via a relay; and wherein the load-specific operating condition is measured by the controller device via the electrical load measurement circuit.

Clause 17. The battery management system of any of Clauses 14-16, wherein the measurement circuit of each module interface device includes a resistor; and wherein the module-specific measurement includes an electrical voltage or an electrical current measured across the resistor.

Clause 18. The battery management system of any of Clauses 14-17, wherein the test process performed by the controller device with respect to the battery system further includes: while each of the plurality of battery modules are in the disconnected state, measuring the load-specific operating condition across the electrical load to obtain an additional load-specific measurement; wherein the set of test results is further based on the additional load-specific measurement.

Clause 19. The battery management system of any of Clauses 14-18, wherein the test process performed by the controller device with respect to the battery system further includes: while the plurality of battery modules are in the disconnected state, independently measuring the module-specific operating condition of each battery module of the plurality of battery modules via the measurement circuit of the module interface device that is operatively coupled to the cathode and anode terminals of that battery module to obtain an additional module-specific measurement; wherein the set of test results is further based on the additional module-specific measurement for each battery module of the plurality of battery modules.

Clause 20. The battery management system of any of Clauses 14-19, wherein the set of test results include, for each battery module of the plurality of battery modules, an indication of whether the module-specific measurement meets a module criteria; wherein the module-specific operating condition includes at least one of an electrical voltage or an electrical current measured between the anode and cathode terminals of the battery module; and wherein the module criteria includes a target voltage or a target current.

Clause 21. The battery management system of Clause 20, wherein the module criteria differs for at least some of the battery modules of the plurality of battery modules.

Clause 22. An article of manufacture for testing a battery system that includes a plurality of battery modules, the article of manufacture comprising: a data storage machine having instructions stored thereon executable by a logic machine to: perform a test process with respect to the battery system via a battery management system that includes a plurality of module interface devices; wherein for each battery module of the plurality of battery modules, a respective module interface device of the plurality of module interface devices is operatively coupled to anode and cathode terminals of that battery module; wherein the test process includes: independently disconnecting each battery module of the plurality of battery modules from a connected state to a disconnected state with respect to an electrical load via a switching circuit of the module interface device that is operatively coupled to the cathode and anode terminals of that battery module; for each battery module of the plurality of battery modules, independently connecting that battery module from the disconnected state to the connected state with respect to the electrical load via the switching circuit of the module interface device that is operatively coupled to the cathode and anode terminals of that battery module while remaining battery modules of the plurality of battery modules are in the disconnected state; for each battery module of the plurality of battery modules, independently measuring a module-specific operating condition of that battery module in the connected state via a measurement circuit of the module interface device that is operatively coupled to the cathode and anode terminals of that battery module to obtain a module-specific measurement while the remaining battery modules are in the disconnected state; for each battery module of the plurality of battery modules of the battery system, measuring a load-specific operating condition across the electrical load to obtain a load-specific measurement while that battery module is in the connected state and the remaining battery modules are in the disconnected state; and outputting a set of test results that includes or is based on the module-specific measurement and the load-specific measurement for each battery module of the plurality of battery modules obtained while that battery module is in the connected state and the remaining battery modules are in the disconnected state.

Clause 23. The article of Clause 22, wherein the set of test results include, for each battery module of the plurality of battery modules, an indication of whether the module-specific measurement meets a module criteria; wherein the module-specific operating condition includes at least one of an electrical voltage or an electrical current measured between the anode and cathode terminals of the battery module; and wherein the module criteria includes a target voltage or a target current.

Clause 24. The article of Clause 23, wherein the module criteria differs for at least some of the battery modules of the plurality of battery modules.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method for testing a battery system that includes a plurality of battery modules, the method comprising:
 performing a test process with respect to the battery system via a battery management system that includes a controller device and a plurality of module interface devices;
 wherein for each battery module of the plurality of battery modules, a respective module interface device of the plurality of module interface devices is operatively coupled to anode and cathode terminals of that battery module;
 wherein performing the test process includes, at the controller device:
  independently disconnecting each battery module of the plurality of battery modules from a connected state to a disconnected state with respect to an electrical load via a switching circuit of the module interface device that is operatively coupled to the cathode and anode terminals of that battery module;
  for each battery module of the plurality of battery modules, independently connecting that battery module from the disconnected state to the connected state with respect to the electrical load via the switching circuit of the module interface device that is operatively coupled to the cathode and anode terminals of that battery module while remaining battery modules of the plurality of battery modules are in the disconnected state;
  for each battery module of the plurality of battery modules, independently measuring a module-specific operating condition of that battery module in the connected state via a measurement circuit of the module interface device that is operatively coupled to the cathode and anode terminals of that battery module to obtain a module-specific measurement while the remaining battery modules are in the disconnected state;
  for each battery module of the plurality of battery modules of the battery system, measuring a load-specific operating condition across the electrical load to obtain a load-specific measurement while that battery module is in the connected state and the remaining battery modules are in the disconnected state; and
  outputting a set of test results that includes or is based on the module-specific measurement and the load-specific measurement for each battery module of the plurality of battery modules obtained while that battery module is in the connected state and the remaining battery modules are in the disconnected state.

2. The method of claim 1, wherein the module-specific operating condition includes an electrical voltage between the anode and cathode terminals of the battery module; and
 wherein the load-specific operating condition includes an electrical voltage.

3. The method of claim 1, wherein the module-specific operating condition includes an electrical current between the anode and cathode terminals of the battery module; and
 wherein the load-specific operating condition includes an electrical current.

4. The method of claim 1, wherein performing the test process further includes:
 while each of the plurality of battery modules are in the disconnected state, measuring the load-specific operating condition across the electrical load to obtain an additional load-specific measurement;
 wherein the set of test results is further based on the additional load-specific measurement.

5. The method of claim 4, wherein the set of test results include an indication whether the additional load-specific measurement meets a load criteria.

6. The method of claim 5, wherein the load-specific operating condition includes an electrical voltage or an electrical current; and
 wherein the load criteria includes a target value of zero voltage or zero current.

7. The method of claim 1, wherein the set of test results include, for each battery module of the plurality of battery modules, an indication of whether the module-specific measurement meets a module criteria;
 wherein the module-specific operating condition includes at least one of an electrical voltage or an electrical current measured between the anode and cathode terminals of the battery module; and
 wherein the module criteria includes a target voltage or a target current.

8. The method of claim 7, wherein the module criteria differs for at least some of the battery modules of the plurality of battery modules.

9. The method of claim 1, wherein performing the test process further includes:

while the plurality of battery modules are in the disconnected state, independently measuring the module-specific operating condition of each battery module of the plurality of battery modules via the measurement circuit of the module interface device that is operatively coupled to the cathode and anode terminals of that battery module to obtain an additional module-specific measurement;

wherein the set of test results is further based on the additional module-specific measurement for each battery module of the plurality of battery modules.

10. The method of claim 9, wherein the set of test results include an indication whether the additional module-specific measurement for each battery module of the plurality of battery modules meets a module criteria.

11. The method of claim 10, wherein the module-specific operating condition includes an electrical voltage or an electrical current; and wherein the module criteria includes a target value of zero voltage or zero current.

12. The method of claim 1, wherein the set of test results includes an indication whether, for each battery module of the set of battery modules, whether the module-specific measurement obtained for that battery module matches load-specific measurement obtained while that battery module is in the connected state and the remaining battery modules are in the disconnected state.

13. The method of claim 1, wherein the test process is performed by the controller device responsive to a control input.

14. A battery management system for testing a battery system that includes a plurality of battery modules, the battery management system comprising:

a controller device; and a plurality of module interface devices operatively coupled to the controller device in which each module interface device includes a measurement circuit and a switching circuit, wherein for each battery module of the plurality of battery modules, a respective module interface device of the plurality of module interface devices is configured to be operatively coupled to anode and cathode terminals of that battery module;

wherein the controller device is configured to perform a test process with respect to the battery system that includes:

independently disconnecting each battery module of the plurality of battery modules from a connected state to a disconnected state with respect to an electrical load via the switching circuit of the module interface device that is operatively coupled to the cathode and anode terminals of that battery module;

for each battery module of the plurality of battery modules, independently connecting that battery module from the disconnected state to the connected state with respect to the electrical load via the switching circuit of the module interface device that is operatively coupled to the cathode and anode terminals of that battery module while remaining battery modules of the plurality of battery modules are in the disconnected state;

for each battery module of the plurality of battery modules, independently measuring a module-specific operating condition of that battery module via the measurement circuit of the module interface device that is operatively coupled to the cathode and anode terminals of that battery module to obtain a module-specific measurement while the remaining battery modules are in the disconnected state;

for each battery module of the plurality of battery modules of the battery system, measuring a load-specific operating condition across the electrical load to obtain a load-specific measurement while that battery module is in the connected state and the remaining battery modules are in the disconnected state; and outputting a set of test results that includes or is based on the module-specific measurement and the load-specific measurement for each battery module of the plurality of battery modules obtained while that battery module is in the connected state and the remaining battery modules are in the disconnected state.

15. The battery management system of claim 14, wherein each module interface device of the plurality of module interface devices includes:

a module-side cathode interface by which the module interface device is configured to be operatively coupled to the cathode terminal of the battery module;

a module-side anode interface by which the module interface device is configured to be operatively coupled to the anode terminal of the battery module;

an electrical load-side cathode interface by which the module interface device is configured to operatively coupled to the electrical load; and an electrical load-side anode interface by which the module interface device is configured to operatively coupled to the electrical load.

16. The battery management system of claim 14, wherein further comprising:

an electrical load measurement circuit operatively coupled to opposing sides of the electrical load via a relay; and wherein the load-specific operating condition is measured by the controller device via the electrical load measurement circuit.

17. The battery management system of claim 14, wherein the measurement circuit of each module interface device includes a resistor; and wherein the module-specific measurement includes an electrical voltage or an electrical current measured across the resistor.

18. The battery management system of claim 14, wherein the test process performed by the controller device with respect to the battery system further includes:

while each of the plurality of battery modules are in the disconnected state, measuring the load-specific operating condition across the electrical load to obtain an additional load-specific measurement;

wherein the set of test results is further based on the additional load-specific measurement.

19. The battery management system of claim 14, wherein the test process performed by the controller device with respect to the battery system further includes:

while the plurality of battery modules are in the disconnected state, independently measuring the module-specific operating condition of each battery module of the plurality of battery modules via the measurement circuit of the module interface device that is operatively coupled to the cathode and anode terminals of that battery module to obtain an additional module-specific measurement;

wherein the set of test results is further based on the additional module-specific measurement for each battery module of the plurality of battery modules.

20. An article of manufacture for testing a battery system that includes a plurality of battery modules, the article of manufacture comprising:

a data storage machine having instructions stored thereon executable by a logic machine to:

perform a test process with respect to the battery system via a battery management system that includes a plurality of module interface devices;

wherein for each battery module of the plurality of battery modules, a respective module interface device of the plurality of module interface devices is operatively coupled to anode and cathode terminals of that battery module;

wherein the test process includes:

independently disconnecting each battery module of the plurality of battery modules from a connected state to a disconnected state with respect to an electrical load via a switching circuit of the module interface device that is operatively coupled to the cathode and anode terminals of that battery module;

for each battery module of the plurality of battery modules, independently connecting that battery module from the disconnected state to the connected state with respect to the electrical load via the switching circuit of the module interface device that is operatively coupled to the cathode and anode terminals of that battery module while remaining battery modules of the plurality of battery modules are in the disconnected state;

for each battery module of the plurality of battery modules, independently measuring a module-specific operating condition of that battery module in the connected state via a measurement circuit of the module interface device that is operatively coupled to the cathode and anode terminals of that battery module to obtain a module-specific measurement while the remaining battery modules are in the disconnected state;

for each battery module of the plurality of battery modules of the battery system, measuring a load-specific operating condition across the electrical load to obtain a load-specific measurement while that battery module is in the connected state and the remaining battery modules are in the disconnected state; and outputting a set of test results that includes or is based on the module-specific measurement and the load-specific measurement for each battery module of the plurality of battery modules obtained while that battery module is in the connected state and the remaining battery modules are in the disconnected state.

* * * * *